United States Patent
Kobayashi et al.

[11] Patent Number: 6,083,361
[45] Date of Patent: *Jul. 4, 2000

[54] SPUTTER DEVICE

[75] Inventors: Masahiko Kobayashi, Kanagawa-ken; Yoichiro Numasawa, Tokyo, both of Japan

[73] Assignee: Anelva Corporation, Fuchu, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/013,288

[22] Filed: Jan. 26, 1998

[30] Foreign Application Priority Data

May 28, 1997 [JP] Japan .................................. 9-155980

[51] Int. Cl.$^7$ .................................................. C23C 14/34
[52] U.S. Cl. .............................. 204/192.15; 204/192.12; 204/298.06; 204/298.07
[58] Field of Search ................. 204/192.12, 192.15, 204/192.3, 298.06, 298.07, 298.13, 298.16, 298.33, 298.34, 298.37

[56] References Cited

U.S. PATENT DOCUMENTS

| | | | |
|---|---|---|---|
| 4,725,345 | 2/1988 | Sakamoto et al. | 204/192.31 |
| 4,778,582 | 10/1988 | Howard | 204/192.15 |
| 5,196,916 | 3/1993 | Ishigami et al. | 257/769 |
| 5,556,474 | 9/1996 | Otani et al. | 118/723 E |
| 5,563,092 | 10/1996 | Ohmi | 437/101 |
| 5,772,771 | 6/1998 | Li et al. | 118/723 I |
| 5,846,613 | 12/1998 | Neuville | 427/575 |

FOREIGN PATENT DOCUMENTS

96/14448  5/1996  WIPO ............................ C23C 16/26

OTHER PUBLICATIONS

Ionized Magnetron Sputtering for Lining and Filling Trenches and Vias; Semiconductor International; Feb. 1996; pp. 99–100, 102.

Magnetron Sputter Depositions for Interconnect Applications; Conference Proceedings ULSI XI; 1996 Materials Research Society; pp. 227–232.

*Primary Examiner*—Nam Nguyen
*Assistant Examiner*—Steven H. VerSteeg
*Attorney, Agent, or Firm*—Burns, Doane, Swecker & Mathis, LLP

[57] ABSTRACT

A sputtering device includes a sputter chamber equipped with a vacuum pump system; a metal target provided inside the sputter chamber; a sputtering power source for producing a sputter discharge and sputtering the target to create sputter particles; a substrate holder for holding a substrate in the position where the sputter particles land; and a gas introduction device for introducing into the sputter chamber a reactive gas that reacts with the sputter particles released from the target, and produces a compound that has a lower sticking characteristic to a special region of the substrate than do the sputter particles alone, wherein the compound can be dissociated in another region of the substrate. A method of sputtering includes the steps of producing a sputter discharge with a sputtering power source for sputtering a metal target in a sputter chamber to create sputter particles; holding a substrate in a position where the sputter particles land; introducing into the sputter chamber a reactive gas that reacts with the sputter particles released from the target to produce a compound that has a lower sticking characteristic to a special region of the substrate than do the sputter particles alone; and dissociating the compound in another region of the substrate.

27 Claims, 5 Drawing Sheets

SPUTTER DEVICE

BACKGROUND OF THE APPLICATION

1. Field of the Invention

The present invention relates to a sputtering device used in the fabrication of various types of semiconductor devices. More particularly, it relates to a sputtering device suited to the deposition of films inside holes with a high aspect ratio.

2. Discussion of Related Art

With semiconductor devices, such as various types of memory and logic devices, a sputtering process is used in the production of various wiring films, and in the production of barrier films that prevent the interdiffusion of different layers. A sputtering process uses a sputtering device, and there has recently been a great need for such sputtering devices to allow the inner surfaces of holes formed in a substrate to be coated with a good degree of coverage.

A CMOS-FET (Field Effect Transistor), which is commonly used in a DRAM, employs a structure that prevents cross-contamination between the contact wiring layer and the diffusion layer by the provision of a barrier film to the inner surface of the contact holes provided on the diffusion layer. With a multilayer wiring structure for the wiring of memory cells, through holes are provided to an interlayer insulation film, and interlayer wiring is embedded inside these through holes in order to link the lower layer wiring with the upper layer wiring. Here again, a structure is adopted in which a barrier film is produced inside the through holes to prevent cross-contamination.

Because of the increasing degree of integration, the aspect ratio of these holes (the ratio of the hole depth to the size of the hole opening) has been steadily rising over the years. For example, the aspect ratio is about 4 with a 64 megabit DRAM, and is about 5 to 6 with a 256 megabit DRAM.

In the case of a barrier film, a thin film must be built up on the bottom of the hole in an amount of 10 to 15% of the amount of build-up on the peripheral surfaces of the hole. For holes with a high aspect ratio, it is difficult to deposit a film with a high bottom coverage (the ratio of the deposition rate on the hole bottom to the deposition rate on the peripheral surfaces of the hole). A decrease in the bottom coverage can lead to a thinner barrier film at the bottom of the hole and to critical flaws in the device characteristics, such as junction leakage.

Collimation sputtering and low-pressure long-distance sputtering processes have been developed up to now as sputtering processes that increase the bottom coverage. Collimation sputtering involves using a plate (collimator) in which numerous holes have been made in the direction perpendicular to the substrate, and providing this plate between the target and the substrate. Having the sputter particles pass through these holes selectively causes only those sputter particles that fly more or less perpendicular to the substrate to arrive at the substrate.

Low-pressure long-distance sputtering involves lengthening the distance between the target and substrate (usually about 3 to 5 times farther) so that relatively more of the sputter particles that fly more or less perpendicular to the substrate will land on the substrate, and lowering the pressure more than usual (about 0.8 mTorr or less) so that the free mean path is longer, which results in less turbulence of these sputter particles.

Collimation sputtering yields better results than an ordinary sputtering device in that a bottom coverage of about 20 to 30% is obtained with respect to a hole with an aspect ratio of 2. However, a problem with collimation sputtering is that sputter particles accumulate on the collimator portion, and the resulting loss of material decreases the film deposition rate, or the thin film that builds up on the collimator can peel off and become dust particles. Collimation sputtering is held to be limited to devices of the 16-megabit class, in which the aspect ratio is about 3.

With low-pressure, long-distance sputtering, a bottom coverage of approximately 40% is obtained for a hole with an aspect ratio of 2, and a bottom ratio of approximately 20% for a hole with an aspect ratio of 3.5, so the performance is better than with collimation sputtering. However, since the pressure is lowered and the distance between the target and the substrate is lengthened with low-pressure long-distance sputtering, there is a fundamental decrease in the film deposition rate. Therefore, low-pressure long-distance sputtering is also held to be limited to devices with an aspect ratio of about 4.

OBJECTS AND SUMMARY

An object of the present invention is to allow a film to be deposited with good bottom coverage on the inner surfaces of holes whose aspect ratio is over 4.

In order to achieve the stated object, a sputtering device comprises a sputter chamber equipped with a vacuum pump system; a metal target provided inside the sputter chamber; a sputtering power source for producing a sputter discharge and sputtering the target to create sputter particles; a substrate holder for holding a substrate in the position where the sputter particles land; and gas introduction means for introducing into the sputter chamber a reactive gas that reacts with the sputter particles released from the target, and produces a compound that has a lower sticking characteristic to a special region of the substrate than do said sputter particles alone, wherein the compound can be dissociated in another region of the substrate.

A method of sputtering according to the present invention comprises the steps of producing a sputter discharge with a sputtering power source for sputtering a metal target in a sputter chamber to create sputter particles; holding a substrate in a position where the sputter particles land; and introducing into the sputter chamber a reactive gas that reacts with the sputter particles released from the target to produce a compound that has a lower sticking characteristic to a special region of the substrate than do said sputter particles alone; and dissociating the compound in another region of the substrate.

DETAILED DESCRIPTION OF THE PREFERRED EMBODIMENTS

Figure 1:
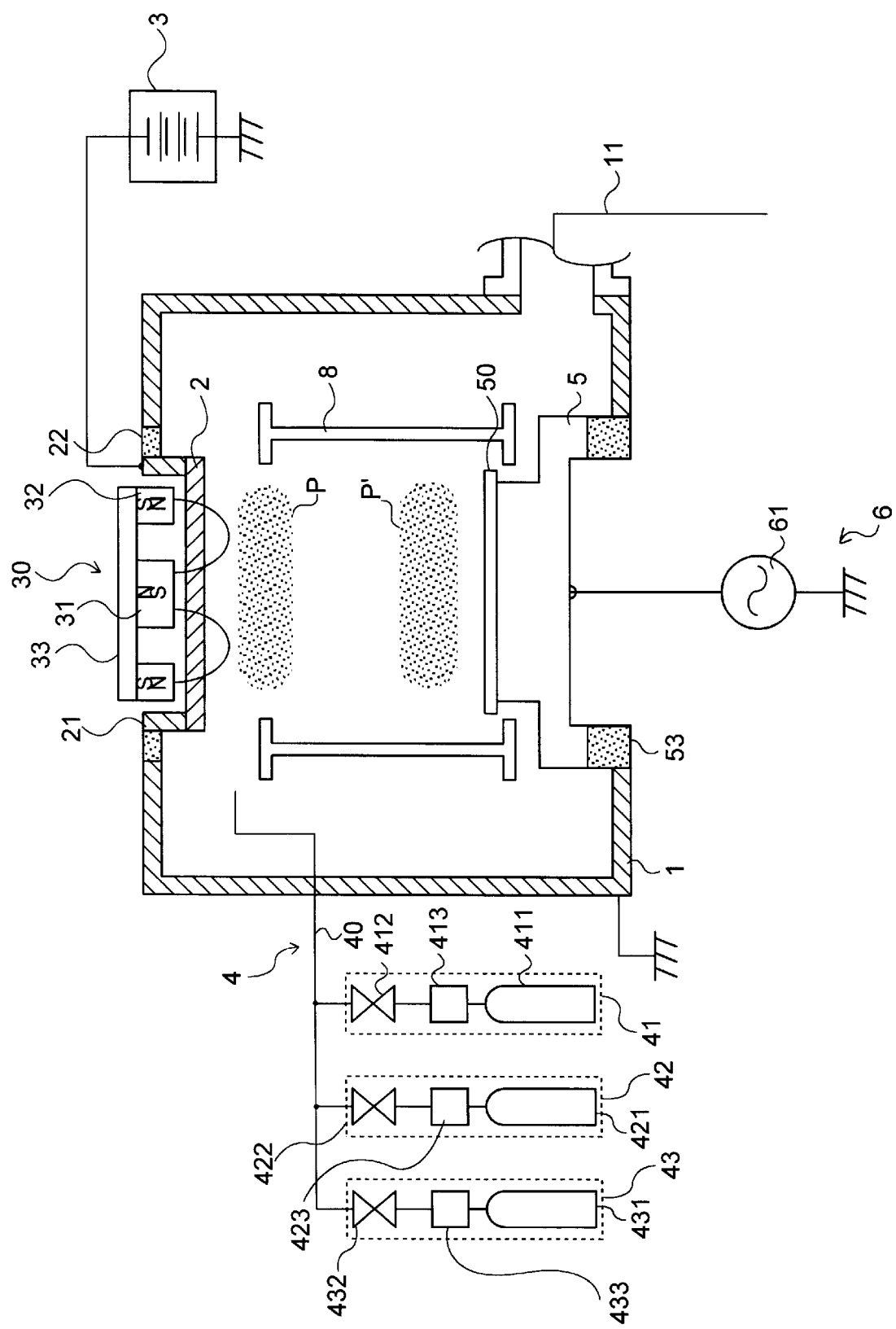
FIG. 1 is a simplified front view of the structure of the sputtering device in an embodiment of the present invention.

FIG. 1 is a simplified front view of the structure of the sputtering device in an embodiment of the present invention.

The sputtering device in this embodiment has a sputter chamber 1 equipped with vacuum pump system 11. The sputter chamber 1 has a target 2 provided on its inside, a sputtering power source 3 that sputters this target 2, and a gas introduction means 4 for introducing the desired gas into the sputter chamber 1. The sputter particles released from the target 2 are directed at a substrate 50 held by a substrate holder 5.

The sputter chamber 1 is an airtight vessel equipped with a gate valve (not shown). This sputter chamber 1 is made of a metal, such as stainless steel, and is electrically grounded.

The vacuum pump system 11 is a multi-stage vacuum pump furnished with a turbo molecular pump and a diffusion pump. The vacuum pump system 11 is capable of pumping out the inside of the sputter chamber 1 down to about $10^{-8}$ Torr. The vacuum pump system 11 is equipped with an pumping speed adjuster (not shown), such as a variable orifice, which allows the pumping speed to be adjusted.

The target 2 is made of metal, and in this embodiment is formed from titanium. The target 2 is in the form of a disk that is 6 mm thick and about 300 mm in diameter. The target 2 is attached to the sputter chamber 1 via a metal target holder 21 and an insulator 22.

A magnet assembly 30 is provided behind the target 2 so that magnetron sputtering can be performed. The magnet assembly 30 consists of a center magnet 31, a peripheral magnet 32 that surrounds this center magnet 31, and a disk-shaped yoke 33 that ties the center magnet 31 to the peripheral magnet 32. The magnets 31 and 32 are both permanent magnets, but they can instead comprise electromagnets.

The sputtering power source 3 applies a constant, negative, high voltage to the target 2. When titanium is being sputtered, for example, a negative, direct current voltage of about 700 V is applied.

The gas introduction means 4 introduces argon, which is used as a sputter discharge gas for producing a sputter discharge, hydrogen, which is used as the reactive gas, and nitrogen into the sputter chamber 1.

The gas introduction means 4 has an argon introduction system 41, a hydrogen gas introduction system 42, and a nitrogen gas introduction system 43. These gas introduction systems 41, 42, and 43 respectively comprise cylinders 411, 421, and 431 filled with their respective gases, valves 412, 422, and 432 provided to the piping, and flux adjusters 413, 423, and 433.

The argon introduction system 41, the hydrogen gas introduction system 42, and the nitrogen gas introduction system 43 are connected to the same main pipe 40. The gases can be introduced into the sputter chamber after being mixed in the desired proportions, or a certain gas can be selected by switching of the valves 412, 422, and 432. The main pipe 40 of the gas introduction means 4 passes airtightly through the sputter chamber 1, and introduces the gases toward a sputter discharge space beneath the target 2.

The substrate holder 5 is airtightly provided to the sputter chamber 1 via an insulator 53, and holds the substrate 50 parallel to the target 2. An electrostatic chucking mechanism (not shown) that attracts the substrate 50 through static electricity is provided to the substrate holder 5. This electrostatic chucking mechanism consists of chucking electrodes provided inside the substrate holder 5, and a chucking power source that applies a direct current voltage to the chucking electrodes. A heating mechanism (not shown) that heats the substrate 50 during film deposition so as to make the film deposition more efficient is sometimes provided inside the substrate holder 5.

The device in this embodiment is provided with an electric field establishment means 6 for setting up an ion-irradiation electric field that is used to direct the ions perpendicularly at the substrate 50. In this embodiment, the electric field establishment means 6 comprises a substrate-biasing power source 61 that imparts a self-biased voltage to the substrate 50 through interaction between high frequency waves and a plasma.

The substrate-biasing power source 61 has a frequency of 13.56 MHz and an output of about 200 W. High frequency power is supplied to the substrate holder 5 via a regulator (not shown). The substrate-biasing power source 61 may instead have a frequency of about 60 to 100 MHz.

When a sputter discharge is created by the sputtering power source 3, a plasma P is produced through discharge beneath the target 2. When the high frequency voltage is applied to the substrate 50 by the substrate-biasing power source 61, a weak plasma P' is produced in the space above the substrate 50. The charged particles within this plasma P' are periodically attracted to the surface of the substrate 50. Electrons, with their higher degree of mobility, are attracted to the surface of the substrate 50 in greater number than positive ions, as a result of which the surface of the substrate 50 is in the same state as if it were biased with a negative potential. In the case of the substrate-biasing power source 61 used in this example, a bias voltage of about −100 V can be imparted on average to the substrate 50.

The state in which the above-mentioned substrate bias voltage has been imparted is the same as that in a cathode sheath region when a plasma is formed by direct current diode discharge, and is a state in which an ion-irradiation electric field having a potential gradient that drops toward the substrate 50 is set up between the plasma P' and the substrate 50. This ion-irradiation electric field causes the ions present above the substrate 50 to be extracted and arrive at the substrate 50 more efficiently.

The device of this embodiment includes an anti-adhesion shield 8 that prevents the sputter particles from adhering to unnecessary places inside the sputter chamber 1. The anti-adhesion shield 8 is a roughly cylindrical member, and is provided such that it surrounds the space between the target 2 and the substrate holder 5.

If the sputter particles adhere to unnecessary places, such as the walls of the sputter chamber 1, a thin film will build up over time. Once this thin film reaches a certain thickness, it flakes off due to internal stress. The film flakes that come off become dust particles that float in the sputter chamber 1. When these dust particles reach the substrate 50, they produce defects, such as local film thickness unevenness. With the device of this embodiment, the space between the target 2 and the substrate holder 5 is surrounded by the anti-adhesion shield 8, so the sputter particles are prevented from adhering to unnecessary places.

Irregularities that prevent the adhered thin film from peeling off are formed on the surface of the anti-adhesion shield 8. The anti-adhesion shield 8 is replaceably provided. When the adhering thin film becomes thick enough that it will peel off, the anti-adhesion shield 8 is replaced with a new one, or with one from which the thin film has been removed.

The operation of the sputtering device in the above embodiment will now be described.

The substrate 50 is conveyed through a gate valve (not shown) and into the sputter chamber 1, where it is placed on the substrate holder 5. The inside of the sputter chamber 1 has already been pumped down to about $10^{-8}$ Torr. After the substrate 50 is in place, the gas introduction means 4 is actuated, and argon (used as the sputter discharge gas) and hydrogen (used as the reactive gas) are introduced at a constant flux.

The pumping speed adjuster of the vacuum pump system 11 is controlled so as to maintain the inside of the sputter chamber 1 at about 60 mTorr, and sputter discharge is commenced in this state. A constant voltage is imparted to the target 2 by the sputtering power source 3, and the target 2 is bombarded by the ionized argon gas, which produces a magnetron sputter discharge. This magnetron sputter discharge forms a plasma P beneath the target 2. At the same time, the substrate-biasing power source 61 is actuated as the electric field establishment means 6, and an ion-irradiation electric field is set up.

The sputter particles released from the target 2 by sputtering reach the substrate 50 and build up as a thin film on the substrate 50. Once a thin film has been built up to the desired thickness, the substrate-biasing power source 61, the sputtering power source 3, and the gas introduction means 4 are turned off, and the substrate 50 is conveyed out of the sputter chamber 1. With metal sputtering, the sputter particles are released from the target in an atomic state in nearly all cases, so in the following description, the term "sputter particles" may be substituted for "sputter atoms".

An example will now be given of the use of the device of the above embodiment in the production of a barrier film for an integrated circuit. First, argon is introduced as the sputter discharge gas, and a titanium thin film is deposited by the method discussed above. After this, the sputter discharge gas is changed to nitrogen, which is introduced, and a titanium nitride thin film is deposited while the reaction between the nitrogen and the titanium is utilized supplementally.

Figure 2:
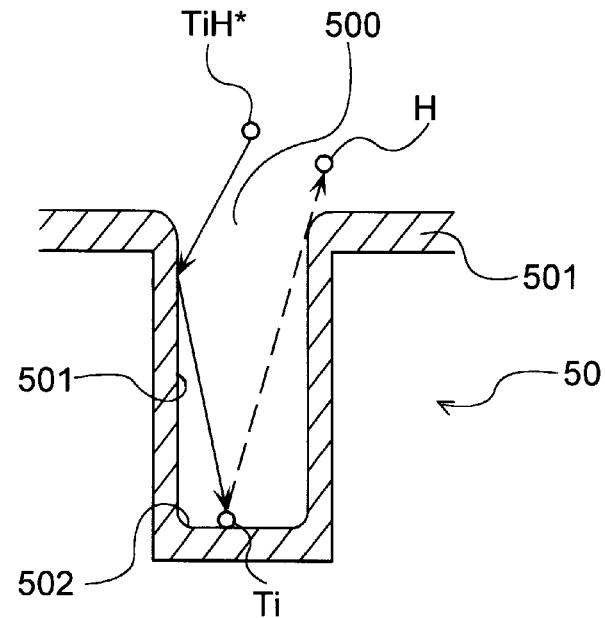
FIG. 2 is a simplified cross section of the built-up thin film, and is used to illustrate the effect of the reactive gas.

One of the most salient features of the device in this embodiment is that the sticking of sputter atoms to the surface of the substrate 50 is controlled in order to increase the bottom coverage for a fine hole formed in the surface of the substrate 50. This point will be described in detail below. FIG. 2 is a simplified cross section of the built-up thin film, and is used to illustrate the effect of the reactive gas.

When the above-mentioned reactive gas, such as hydrogen, is introduced as a mixture in the desired proportion with a sputter discharge gas such as argon, sticking of the sputter particles to the substrate 50 is decreased by a reaction between the sputter atoms and the reactive gas. As a result, bottom coverage for fine holes can be enhanced.

If the flux ratio between the argon gas and the hydrogen gas in the sputtering of the above-mentioned titanium target 2 is set at about 9:1, for example, and the sputtering is carried out at a pressure of about 60 mTorr, the bottom coverage is improved by about 40 to 60% for a hole with an aspect ratio of 4, compared to when 100% argon gas is used. The cause of this is not entirely clear, but is surmised to be as follows.

The introduced hydrogen gas is activated by the plasma formed in the sputter discharge of the argon gas, and this generates hydrogen radicals. These hydrogen radicals react with the titanium atoms released from the target 2, generating TiH radicals.

These TiH radicals have a high vaporization pressure, and therefore have a small sticking coefficient, i.e., the degree to which they stick to a surface upon reaching the surface, with respect to the surface of the substrate 50. When these TiH radicals land inside the hole 500 in the surface of the substrate 50, they do not adhere to the side walls 501 of the hole 500, and most of them fall to the bottom 502 of the hole 500. The material of the substrate 50 serves as a catalyst at the bottom 502, the TiH separates into Ti and H, and the Ti builds up a titanium thin film 510. The H volatilizes as hydrogen gas molecules, and is ultimately evacuated from the sputter chamber 1 by the vaccum pump 11.

Thus, the hydrogen gas that serves as the reactive gas has an action whereby it changes the Ti sputter atoms into TiH radicals, and efficiently guides the Ti to the bottom 502 of the hole 500. It is believed to be this action that enhances the bottom coverage of the hole 500.

The sticking coefficient is dependent on the vaporization pressure. The phrase "lower sticking", as used in this document, can also be put as "higher vaporization pressure". The saturated vaporization pressure of Ti at about 300° C. is no more than $10^{-11}$ Torr, while the saturated vaporization pressure of TiH is over 760 Torr. Since the saturated vaporization pressure of TiH radicals is believed to be higher than that of Ti, TiH radicals must have a far higher saturated vaporization pressure than Ti, and their sticking coefficient is therefore lower.

In the reaction of Ti sputter atoms when hydrogen is introduced as the reactive gas as above, the following reactions are predicted to occur in the vapor phase:

$$\text{Ti}+\text{H}^+ \rightarrow \text{Ti}^+ + \text{H} \tag{1}$$

$$\text{Ti}+\text{H}^+ \rightarrow (\text{TiH})^* \tag{2}$$

$$\text{Ti}+\text{H}^* \rightarrow (\text{TiH})^* \tag{3}$$

Formula 1 is a reaction in which the Ti sputter atoms are changed into Ti ions by having their electrons captured by hydrogen ions. Formula 2 is a reaction in which the Ti sputter atoms react with the hydrogen ions and produce TiH radicals. Formula 3 is a reaction in which the Ti sputter atoms react with the hydrogen radicals and produce TiH radicals.

Meanwhile, it is predicted that the following reactions occur on the surface of the substrate 50:

$$(\text{TiH})^* \rightarrow \text{TiH} \tag{4}$$

$$\text{TiH} \rightarrow \text{Ti}+\text{H} \tag{5}$$

Formula 4 expresses the process whereby the TiH radicals are deactivated through collision with the surface of the substrate 50, and Formula 5 expresses a reaction in which the TiH separates into Ti (solid) and H (gas). Ti is the material that builds up the titanium thin film, and H becomes $H_2$ and is released back into the space. The $H_2$ is reused in the above reaction, or is finally evacuated by the vacuum pump system 11.

In most cases, Formulas 4 and 5 seem to be continuous. The TiH radicals produced by Formula 2 or 3 become TiH upon being deactivated through one or more collisions with the surface of the substrate 50, and this product is believed to separate into Ti and H upon reaching the surface of the substrate 50.

The reason for the above-mentioned increase in bottom coverage when hydrogen is used as the reactive gas is believed to be that the reaction of this Formula 4 occurs frequently only when there are collisions with the side surfaces of the hole, and the reaction of Formula 5 occurs frequently upon arrival at the bottom of the hole.

Figure 3A:
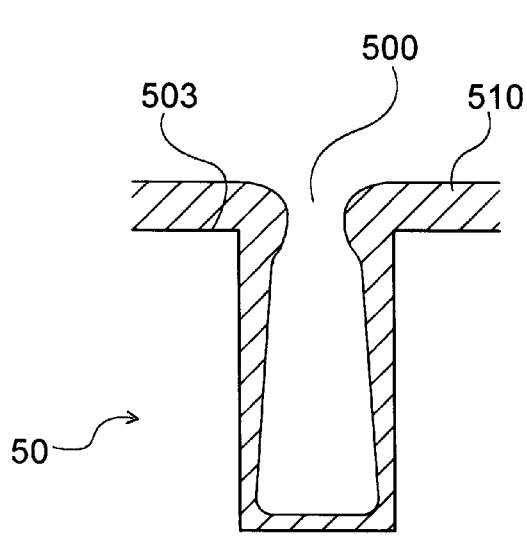
FIG. 3(a) is a simplified cross section of the built-up thin film as occurs in the Prior Art.

The ionized Ti sputter atoms produced in Formula 1 are believed also to produce an ionizing sputtering action. FIG. 3(a) is a simplified cross section of the built-up thin film, and is used to illustrate the action of ionizing sputtering.

As shown in FIG. 3a, in the course of the thin film 510 building up inside the fine hole 500 formed in the surface of the substrate 50, there is a tendency for the thin film to build up in a bulge at the edge 503 portion of the opening to the hole 500. The thin film 510 that makes up this bulge portion is called an "overhang". The formation of this overhang raises the apparent aspect ratio through a narrowing of the opening to the hole 500. The amount of sputter atoms that reach the inside of the hole 500 decreases, and the bottom coverage is diminished.

Figure 3B:
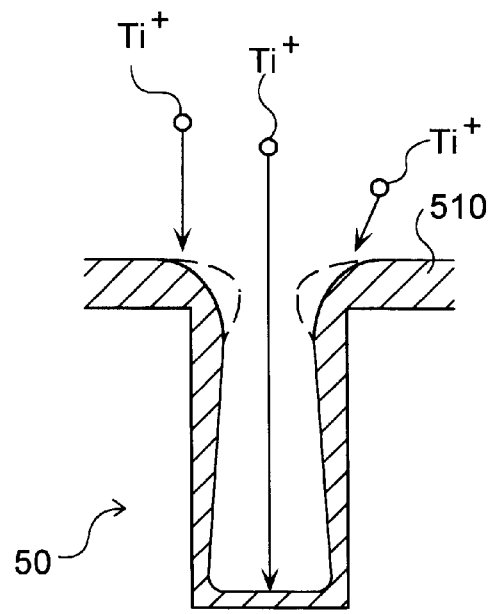
FIG. 3(b) is a simplified cross section used to illustrate the action of ionizing sputtering.

As shown in FIG. 3b, when the ionized Ti sputter atoms reach the substrate 50, they act so as to re-sputter and break up the thin film 510 at the overhang portion, and knock this portion into the hole 500. Accordingly, there is an increase in bottom coverage since the opening to the hole 500 is prevented from narrowing, and the film accumulation on the bottom 502 of the hole 500 is promoted. This re-sputtering of the overhang can be produced not only by the ionized Ti sputter atoms, but also by the hydrogen ions or the ions of argon gas used as the sputter discharge gas.

With the device of this embodiment, the above-mentioned electric field establishment means 6 sets up an ion-irradiation electric field having a potential gradient that drops toward the substrate 50. The above-mentioned ionized Ti sputter atoms tend to be guided by this ion-irradiation electric field and to move perpendicular to the substrate 50. The ionized Ti sputter atoms readily reach the bottom 502 of the deep hole 500, and this is also believed to contribute to the increase in bottom coverage.

Thus, with the device of this embodiment, a reaction that lowers the adhesion of the sputter atoms to the surface of the substrate 50 is utilized supplementally, and the action of the ionizing sputtering is also utilized, which deposits a film with a high level of bottom coverage.

Figure 4:
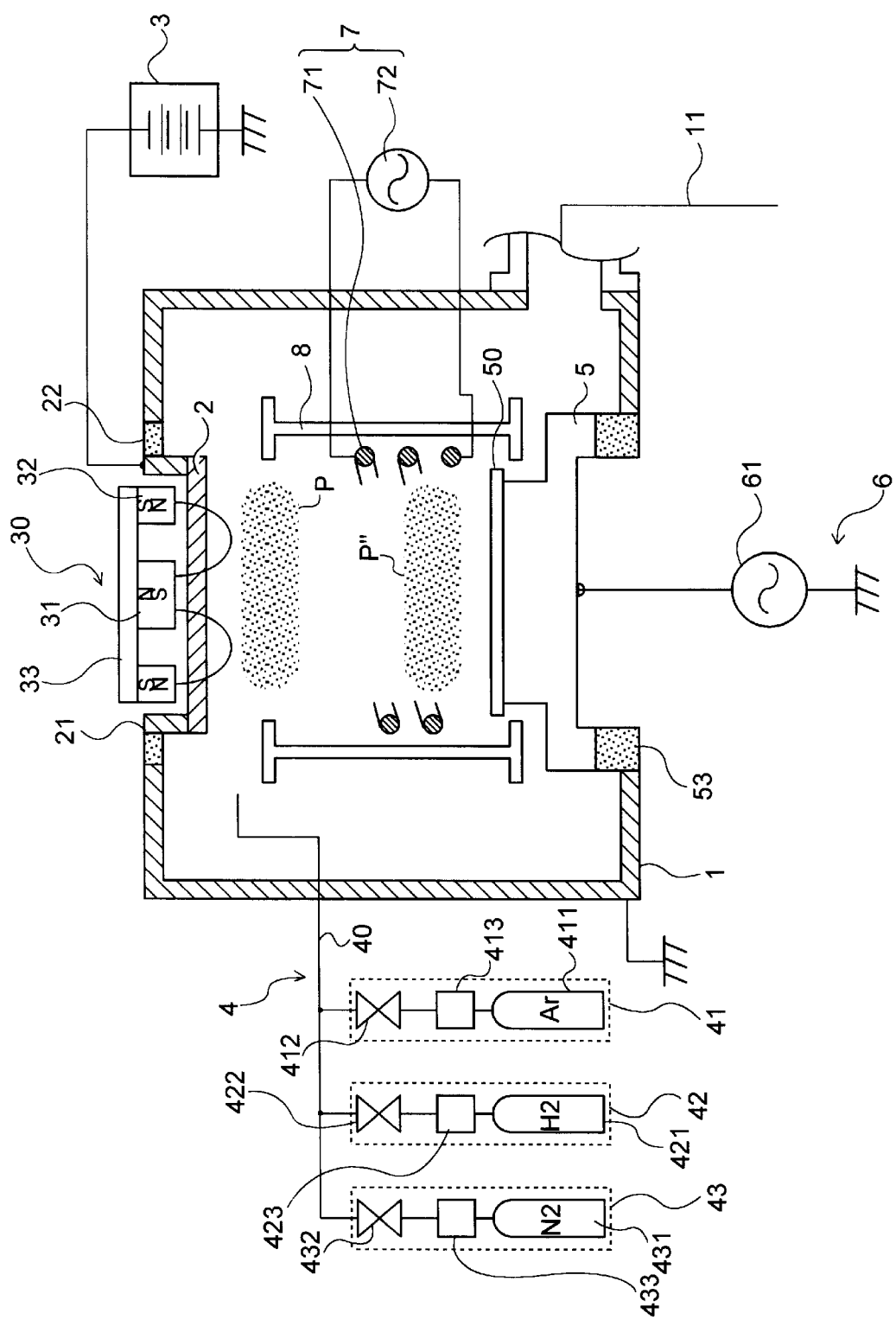
FIG. 4 is a simplified front view of the structure of the sputtering device in a second embodiment.

Next, a second embodiment of the present invention will be described. FIG. 4 is a simplified front view of the structure of the sputtering device in the second embodiment.

The device in this second embodiment differs from the device in the first embodiment in that a plasma formation means 7 for forming another plasma P'' and ionizing the sputter atoms or the reactive gas is provided along the flight path of the sputter particles from the target 2 to the substrate 50.

In this embodiment, the plasma formation means 7 forms the plasma P'' by inducing a high frequency electric field in the plasma formation space set up along the flight path of the sputter particles. The plasma formation means 7 consists of a high frequency coil 71 positioned so that it surrounds the plasma formation space, and a plasma-use high frequency power source 72 that supplies a specific high frequency electric power to the high frequency coil 71 via a regulator (not shown). The plasma-use high frequency power source 72 has a frequency of 13.56 MHz and an output of about 3 kW.

The argon gas introduced as the sputter discharge gas by the gas introduction means 4, and the hydrogen gas introduced as the reactive gas are converted into a plasma by the energy imparted to them from the high frequency electric field induced by the high frequency coil 71, forming the plasma P''. Many hydrogen ions and hydrogen radicals are generated in this plasma P''. These hydrogen ions and hydrogen radicals produce TiH radicals and Ti ions as shown by Formulas 1 to 5 above, and contribute to an increase in bottom coverage, just as above.

As discussed above, hydrogen ions and hydrogen radicals are also produced in the plasma P formed by sputter discharge. In this embodiment, since they are further produced in the plasma P'', a larger amount of hydrogen ions and hydrogen radicals are obtained, so the effect of enhancing bottom coverage can be further improved.

Since the plasma P'' is formed along the flight path of the sputter atoms, many of the Ti sputter atoms flying from the target 2 are ionized directly in the plasma P''. The above-mentioned ionization rate is also boosted in this embodiment, and this contributes to even better bottom coverage.

Figure 5:
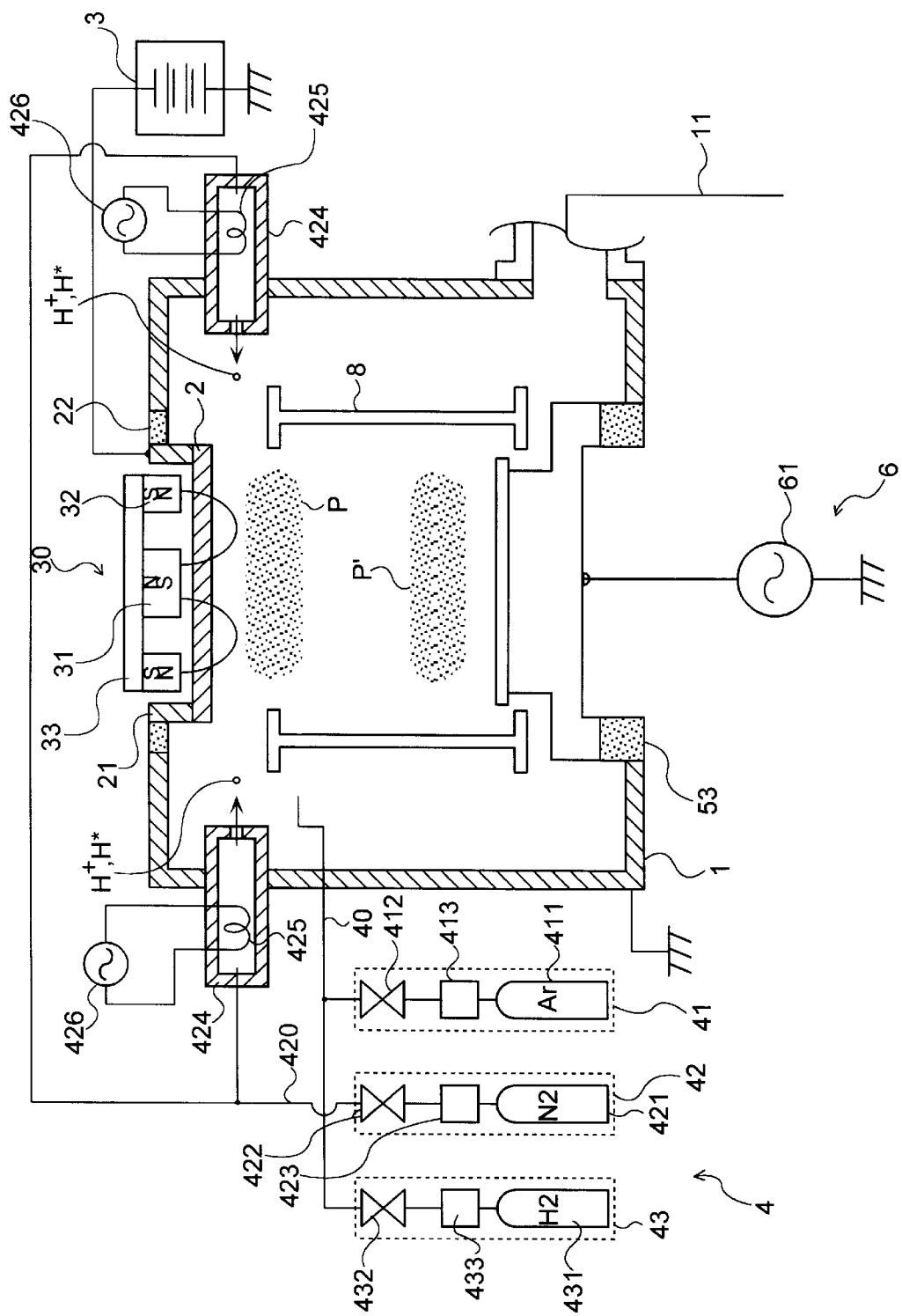
FIG. 5 is a simplified front view of the structure of the sputtering device in a third embodiment.

Next, a third embodiment of the present invention will be described. FIG. 5 is a simplified front view of the structure of the sputtering device in the third embodiment.

The device in this third embodiment differs from the device in the first and second embodiments in that the gas introduction means 4 introduces the reactive gas in an activated or ionized state.

With the gas introduction means 4 in this embodiment, the argon gas introduction system 41 and the nitrogen gas introduction system 43 are connected to the same main pipe 40. The gases can be introduced into the sputter chamber after being mixed in the desired proportions, or a certain gas can be selected by switching of the valves 412 and 432.

As shown in FIG. 5, the pipe 420 of the hydrogen gas introduction system 42 has a plurality of branches, to the distal end of each of which is connected an energy supply pipe 424. The energy supply pipes 424 are in the form of cylinders with an inside diameter of about 30 mm, and their interiors are airtightly connected to the sputter chamber 1 in a state in which they communicate with the inside of the sputter chamber 1. About four of the energy supply pipes 424 are provided, and these are connected at equal intervals to the side walls of the sputter chamber 1.

A high frequency antenna 425 is provided inside each of the energy supply pipes 424. The high frequency antennas 425 are connected to a reactive gas-use high frequency power source 426. A single loop type of antenna is used as the high frequency antenna 425 in this embodiment. High frequency electric power is supplied from and excited by the reactive gas-use high frequency power source 426, and a high frequency electric field is emitted inside the energy supply pipe 424. The reactive gas-use high frequency power source 426 is one with a frequency of 60 MHz and an output of about 200 W.

The high frequency electric field emitted from the high frequency antenna 425 ionizes or activates the hydrogen gas introduced from the pipe 420 by imparting energy to this gas. As a result, hydrogen ions and hydrogen radicals are abundantly supplied from the energy supply pipe 424. More of the reactions expressed by the above Formulas 1 to 5 occur, and the improvement in bottom coverage is even better.

The plasma formation means 7 used in the second embodiment does not need to be employed with this embodiment because the hydrogen ions and hydrogen radicals are abundantly supplied as mentioned above. However, the hydrogen ionization and activation effect will be even better if the plasma formation means 7 is employed in this third embodiment as well.

If the hydrogen ions supplied from the energy supply pipes 424 are rebonded, or if the hydrogen radicals are deactivated and become steady-state hydrogen gas, the plasma formed by the plasma formation means 7 can re-ionize or activate these hydrogen gases. This allows the process in the above Formulas 1 to 5 to be maintained more efficiently, so the improvement in bottom coverage can be obtained more efficiently. Since the problem of the rebonding of hydrogen ions or the deactivation of hydrogen radicals can occur when the hydrogen ions or hydrogen radicals are supplied to a site that is away from the substrate, the use of the plasma formation means 7 in this third embodiment is effective.

Again in this third embodiment, the use of the plasma formation means 7 efficiently ionizes the Ti sputter atoms that fly in from the target 2.

Figure 6:
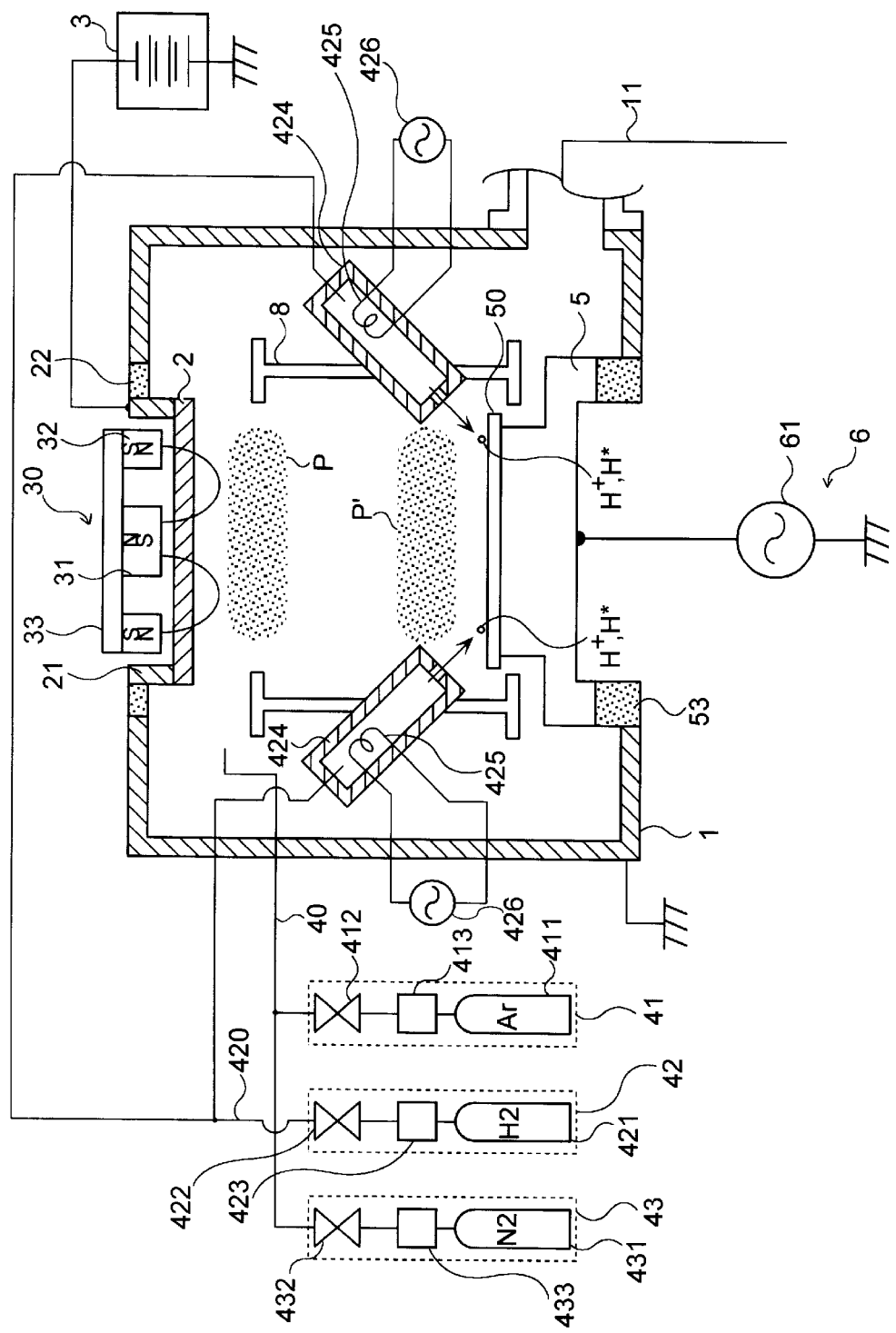
FIG. 6 is a simplified front view of the structure of the sputtering device in a fourth embodiment.

Next, a fourth embodiment of the present invention will be described. FIG. 6 is a simplified front view of the structure of the sputtering device in the fourth embodiment.

The device in this fourth embodiment has a different structure for the gas introduction means 4 from that in the device in the third embodiment. Specifically, in the fourth embodiment, the gas introduction means 4 guides the activated or ionized reactive gas toward a space near the surface of the substrate 50.

As shown in FIG. 6, the distal end openings of the energy supply pipes 424 that are exposed inside the sputter chamber 1 are airtightly connected to the sputter chamber 1 so that they face the substrate 50 on the substrate holder 5. The hydrogen ions and hydrogen radicals are efficiently supplied to the space near the surface of the substrate 50. This allows the process of the above Formulas 1 to 5 to be maintained more efficiently, and allows the improvement in bottom coverage to be obtained more efficiently.

With this fourth embodiment, the hydrogen ions and hydrogen radicals are supplied to a site near the substrate 50, so the need for providing the plasma formation means 7 as in the second embodiment is not as great as in the third embodiment. However, again in this fourth embodiment, the Ti sputter atoms can be ionized by providing the plasma formation means 7.

In the various embodiments given above, titanium was used as an example of the metal target 2, but aluminum, copper, or another metal may be used instead.

The sputter discharge gas was introduced separately from the reactive gas in the various embodiments given above, but there are instances when the sputter discharge can be maintained by the reactive gas itself, in which case there will be times when the sputter discharge gas is not introduced.

In the examples given above, the reactive gas was one that produced a compound that was less likely to stick to the side walls 501 of the hole 500 formed in the surface of the 50, and that could be dissociated at the bottom 502 of the hole 500, but other structures are also possible. For instance, when there is a need to build up a thin film selectively on a specific region alone, a reactive gas that produces a compound that will separate and build up a thin film upon reaching said region is used. This selective build-up of a thin film is similar to plug wiring that fills in a contact hole by the selective growth of tungsten, but there is the possibility that this selective thin film build-up can be accomplished by sputtering rather than CVD (Chemical Vapor Deposition).

The sputtering device of this embodiment can be utilized in the production of various semiconductor devices, as well as liquid crystal displays and various other electronic products.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A sputtering device for depositing a film on a semiconductor substrate, comprising:
   a sputter chamber equipped with a vacuum pump system;
   a metal target provided inside the sputter chamber;
   a sputtering power source for producing a sputter discharge and sputtering the target to create sputter particles including sputter particle atoms;
   a semiconductor substrate holder for holding a semiconductor substrate including a hole having side walls and a bottom or base surface in the position where the sputter particles land; and
   means for introducing into the sputter chamber a reactive gas having reactive gas atoms that react with the sputter particles released from the target and produces a compound from the sputter particle atoms and the reactive gas atoms that has a lower sticking characteristic to the side walls of the hole of the semiconductor substrate than do said sputter particles alone and which compound separates into its component elements including the sputter particle atoms and the reactive gas atoms at the bottom or base surface of the hole of the semiconductor substrate thereby depositing the film on the semiconductor substrate.

2. The sputtering device as defined in claim 1, wherein, when ionized, the reactive gas ionizes the sputter particles by capturing electrons from the sputter particles.

3. The sputtering device as defined in claim 1, wherein the means for introducing the reactive gas into the sputter chamber includes means for introducing the reactive gas in addition to a sputter discharge gas used to produce the sputter discharge.

4. The sputtering device as defined in claim 1, wherein the target is formed from titanium, and the reactive gas is hydrogen.

5. The sputtering device as defined in claim 4, wherein the means for introducing the reactive gas into the sputter chamber includes means for introducing argon gas and nitrogen gas along with the reactive gas composed of hydrogen gas.

6. The sputtering device as defined in claim 1, further comprising a plasma formation means for forming along a flight path of the sputter particles from the target to the substrate a separate plasma from the plasma formed by the sputter discharge, and ionizing the sputter particles or the reactive gas.

7. The sputtering device as defined in claim 1, wherein the means for introducing the reactive gas into the sputter chamber can introduce the reactive gas in an activated or ionized state.

8. The sputtering device as defined in claim 7, wherein the means for introducing the reactive gas into the sputter chamber includes structure for introducing the activated or ionized reactive gas toward a space near a surface of the substrate.

9. The sputtering device as defined in claim 1, further comprising an electric field establishment means for setting up an ion irradiating electric field that is used to irradiate the substrate perpendicularly with ions.

10. The sputtering device as defined in claim 1, wherein the compound having the lower sticking characteristic is a TiH radical.

11. A method of depositing a film on a semiconductor substrate by sputtering, comprising the steps of:
    producing a sputter discharge with a sputtering power source for sputtering a metal target in a sputter chamber to create sputter particles including sputter particle atoms;
    holding a semiconductor substrate in a position where the sputter particles land;
    introducing into the sputter chamber a reactive gas that reacts with the sputter particles released from the target to produce a compound from the sputter particle atoms and the reactive gas atoms that has a lower sticking characteristic to a special region of the semiconductor substrate than do said sputter particles alone;

separating the compound into its component elements including the sputter particle atoms and the reactive gas atoms; and building up the film on another region of the semiconductor substrate by adhering the separated sputter particle atoms to the another region of the semiconductor substrate.

12. The method of sputtering as defined in claim 11, wherein the step of separating the compound in another region includes allowing the compound to deflect off a side wall of a hole in a surface of the semiconductor substrate.

13. The method of sputtering as defined in claim 12, wherein the step of separating the compound further includes deactivating the compound through a collision with a bottom or base surface of the hole of the substrate and separating the compound into atoms comprising the elements making up the compound.

14. The method of sputtering as defined in claim 13, wherein the step of building up the film on the another region of the semiconductor substrate includes adhering the atoms of one of the elements making up the compound to the bottom or base of the hole.

15. The method of sputtering as defined in claim 14, wherein the step of building up a film on the bottom or base of the hole of the substrate further includes evacuating the atoms of the other element making up the compound from the hole in the substrate.

16. The method of sputtering as defined in claim 11, wherein the compound is a TiH radical.

17. The method of sputtering as defined in claim 11, wherein one of the elements formed by separating the compound is hydrogen.

18. The method of sputtering as defined in claim 11, wherein one of the elements formed by separating the compound is titanium.

19. The method of sputtering as defined in claim 11, wherein the metal target is made of titanium.

20. The method of sputtering as defined in claim 11, wherein the step of introducing into the sputter chamber a reactive gas includes creating ionized hydrogen.

21. The method of sputtering as defined in claim 20, wherein the step of producing a sputter discharge includes creating sputter particles of titanium.

22. The method of sputtering as defined in claims 21, wherein the compound produced, during the step of introducing into the sputter chamber a reactive gas and forming ionized hydrogen that reacts with the sputter particles of titanium, is a TiH radical.

23. The method of sputtering as defined in claim 22, wherein the step of separating the compound includes deactivating the TiH radical to form TiH through a collision with the another region of the semiconductor substrate and separating the TiH compound into atoms of Ti and H.

24. The method of sputtering as defined in claim 23, wherein the step of building up the film on the another region of the semiconductor substrate includes adhering the separated Ti atoms to a bottom or base of a hole in the semiconductor substrate.

25. The method of sputtering as defined in claim 24, wherein the step of building up the film on the bottom or base of the hole of the substrate further includes evacuating the separated H atoms from the hole in the substrate.

26. The method of sputtering as defined in claim 11, further including the step of forming a plasma along a flight path of the sputter particles from the target to the substrate, and ionizing the sputter particles or the reactive gas.

27. The method of sputtering as defined in claim 11, wherein the step of introducing a reactive gas includes introducing an activated or ionized reactive gas toward a space near a surface of the substrate.

* * * * *